(12) United States Patent  
Noda et al.

(10) Patent No.: US 12,336,096 B1
(45) Date of Patent: Jun. 17, 2025

(54) DIELECTRIC, COPPER CLAD LAMINATE, CIRCUIT BOARD, METHOD FOR MANUFACTURING COPPER CLAD LAMINATE

(71) Applicant: NIPPON PILLAR PACKING CO., LTD., Osaka (JP)

(72) Inventors: Manami Noda, Osaka (JP); Naozumi Fukushima, Osaka (JP); Takeshi Okunaga, Osaka (JP)

(73) Assignee: NIPPON PILLAR PACKING CO., LTD., Osaka (JP)

( * ) Notice: Subject to any disclaimer, the term of this patent is extended or adjusted under 35 U.S.C. 154(b) by 0 days.

(21) Appl. No.: 18/597,541

(22) Filed: Mar. 6, 2024

(51) Int. Cl.
  *B32B 3/00* (2006.01)
  *H05K 1/03* (2006.01)
  *H05K 3/02* (2006.01)

(52) U.S. Cl.
  CPC ............. *H05K 1/036* (2013.01); *B32B 3/00* (2013.01); *H05K 3/022* (2013.01); *H05K 2201/015* (2013.01); *H05K 2201/0209* (2013.01); *H05K 2201/0254* (2013.01)

(58) Field of Classification Search
  CPC ........ H05K 1/036; H05K 1/0373; B32B 3/00; B32B 27/205; B32B 2305/30; B32B 2264/203; B32B 2457/08
  See application file for complete search history.

(56) References Cited

U.S. PATENT DOCUMENTS

| | | | |
|---|---|---|---|
| 6,417,459 B1 * | 7/2002 | Kanzaki | D03D 15/267 428/209 |
| 11,014,336 B2 * | 5/2021 | Okunaga | B32B 15/095 |
| 11,529,797 B2 * | 12/2022 | Chen | B32B 15/18 |
| 11,818,838 B2 * | 11/2023 | Chen | H05K 1/0366 |
| 2015/0030824 A1 | 1/2015 | Crosley | |
| 2018/0339493 A1 * | 11/2018 | Chen | B32B 15/20 |
| 2020/0404782 A1 * | 12/2020 | Chen | H05K 1/0366 |
| 2021/0060902 A1 | 3/2021 | Okunaga et al. | |

FOREIGN PATENT DOCUMENTS

| | | |
|---|---|---|
| JP | H08-46309 A | 2/1996 |
| JP | 2016-534549 A1 | 11/2016 |
| WO | 2019/049519 A1 | 3/2019 |

* cited by examiner

*Primary Examiner* — Elizabeth E Mulvaney
(74) *Attorney, Agent, or Firm* — Maschoff Brennan (57) ABSTRACT

To improve electric characteristics of a dielectric for use for a high frequency band.

A dielectric 2 formed by lamination of fluorine resin includes a base main layer 3b containing a base material 3a and made of melting fluorine resin, a pair of base cover layers 3c made of melting fluorine resin and formed on both surfaces of the base main layer 3b, and a pair of functional layers 5 made of fluorine resin mixed with hollow fillers 5a and laminated on the outer surfaces of the base cover layers 3c.

11 Claims, 5 Drawing Sheets

| Filler | Solid | Hollow |
|---|---|---|
| Dk (10 GHz) | 2.7 | 1.9 |
| Df (10 GHz) | $2.1 \times 10^{-3}$ | $5.7 \times 10^{-3}$ |

| | Prototype Example 1 | Prototype Example 2 | Prototype Example 3 | Prototype Example 4 | Prototype Example 5 | Prototype Example 6 |
|---|---|---|---|---|---|---|
| Surface Treatment Reagent | None (Untreated) | None (Untreated) | Diphenylsilanediol | Methyltrimethoxysilane | 3,3,3-trifluoropropyltrimethoxysilane | Methyltrimethoxysilane / Diphenylsilanediol |
| Filler Amount (vol%) | 40 | 40 | 40 | 40 | 40 | 40 |
| Water Absorption (%) | 0.87 | 0.92 | 0.19 | 0.22 | 0.13 | 0.18 |
| Presence or Absence of Base Material | Absent | Present | Present | Present | Present | Present |
| Dk (10 GHz) | 1.9 | 2.0 | 2.0 | 2.0 | 2.0 | 2.0 |
| Df (10 GHz) | $5.7 \times 10^{-3}$ | $5.7 \times 10^{-3}$ | $0.8 \times 10^{-3}$ | $0.9 \times 10^{-3}$ | $1.8 \times 10^{-3}$ | $0.7 \times 10^{-3}$ |
| Solder Dip Resistance | × | × | × | ○ | ○ | ○ |

FIG.5

DIELECTRIC, COPPER CLAD LAMINATE, CIRCUIT BOARD, METHOD FOR MANUFACTURING COPPER CLAD LAMINATE

TECHNICAL FIELD

The disclosed technique relates to a dielectric, a copper clad laminate, and a circuit board suitable for information and communication equipment that handles a high frequency band such as a microwave to a millimeter wave and a method for manufacturing the copper clad laminate.

BACKGROUND ART

It is important for the dielectric of this type to suppress electric characteristics such as a relative permittivity (Dk) and a dissipation factor (Df) as low as possible in order to reduce an energy loss such as a transmission loss (for example, Patent Documents 1, 2).

The dielectric (insulating layer) is generally made of, e.g., phenol resin, epoxy resin, polyimide resin, and fluorine resin. Among these synthetic resins, fluorine resin (particularly, polytetrafluoroethylene: PTFE) has the lowest Dk and Df. Thus, in terms of the electric characteristics, fluorine resin is preferably used for the dielectric.

However, although fluorine resin has excellent characteristics such as water repellency, heat resistance, and chemical resistance in addition to the electric characteristics, fluorine resin has disadvantages that it is difficult to perform treatment such as molding or bonding on fluorine resin and to handle fluorine resin. For this reason, in Patent Document 2, the dielectric is formed using epoxy resin and condensed polycyclic aromatic resin.

There has been well-known a technique of mixing synthetic resin forming the dielectric with hollow fine particles in order to decrease the Dk and the Df. Air has lower Dk and Df (Dk=1, Df=0) than those of synthetic resin, and therefore, by mixing with the fine particles, the Dk and Df of the entire dielectric can be decreased.

For example, in Patent Document 1, hollow microspheres having an average particle size of 20 to 100 μm and made of borosilicate are used. The surfaces of these hollow microspheres are dealkalized, and the content of sodium oxide is adjusted to a predetermined concentration or less. In this manner, the Dk and the Df in a high frequency band (10 GHz) are decreased.

In Patent Document 2, hollow glass particles having an average particle size of 38 μm are used. The surfaces of these hollow glass particles are modified using a silane coupling agent such that a hydroxyl group is present in high density. In this manner, affinity for, e.g., epoxy resin is enhanced, and dispersion of the hollow glass particles is improved.

A base material such as glass cloth is generally provided in the dielectric in order to improve, e.g., the strength, dimensional stability, and handiness of a circuit board.

For example, in Patent Documents 1, 2, the base material is provided in the dielectric mixed with the hollow fine particles.

On the other hand, in Patent Document 3, a base material such as glass cloth is provided in a first layer made of, e.g., melting fluorine resin (perfluoroalkoxy alkane: PFA), and on both sides thereof, second layers made of non-melting PTFE containing non-hollow (i.e., solid) inorganic fine particles are provided.

By impregnating the base material with melting resin, formation of a fine air gap (void) around the base material is reduced. Fluorine resin has a higher coefficient of thermal expansion than that of epoxy resin, and for this reason, lacks dimensional stability in a thickness direction. Thus, the second layer is mixed with the inorganic fine particles in order to decrease the coefficient of thermal expansion.

CITATION LIST

Patent Document
 PATENT DOCUMENT 1: Japanese Unexamined Patent Application Publication (Translation of PCT Application) No. 2016-534549
 PATENT DOCUMENT 2: Japanese Unexamined Patent Application Publication No. H08-46309
 PATENT DOCUMENT 3: WO 2019/049519 A1

SUMMARY OF THE INVENTION

Technical Problem

As described above, in order to reduce the energy loss in the high frequency band such as a microwave to a millimeter wave, a decrease in the Dk and the Df is a key. Patent Document 1 describes, as values at 10 GHz, Dk=2.55 and Df=0.0026 (Table 6 of the specification of this document). Moreover, Patent Document 2 describes, although values at 1 GHz, Dk=2.9 and Df=0.001 (Table 1 of the specification of this document).

However, there is still room for improvement in these values in consideration of development of a telecommunication technique such as an automated driving technique for an automobile and a mobile phone.

Note that Patent Document 3 fails to describe the values of the Dk and the Df, but the Dk value of the dielectric is obviously more than 2.1 because the Dk of PTFE having the lowest Dk among synthetic resins is 2.1 and the Dk of the inorganic fine particle is higher than that of fluorine resin (for example, the Dk of silica is 3.8).

Even though the circuit board has excellent electric characteristics, the circuit board cannot be practically used as long as an original functional requirement therefor is not satisfied. For example, the circuit board cannot be practically used if a circuit is disconnected in a storage or the circuit board swells due to heat in soldering.

For these reasons, this specification discloses a technique of improving the electric characteristics of the dielectric for the circuit board while satisfying the original functional requirement.

Solution to the Problem

The disclosed technique relates to a dielectric for a circuit board, which is formed by lamination of fluorine resin.

The dielectric includes a base main layer containing a sheet-shaped base material and made of melting fluorine resin, a pair of base cover layers made of melting fluorine resin and formed on both surfaces of the base main layer such that at least the outer surfaces thereof are positioned apart from the base material, and a pair of functional layers made of fluorine resin mixed with a hollow filler including a hollow fine particle and laminated on the outer surfaces of the base cover layers.

That is, the dielectric is formed by lamination of fluorine resin. Since fluorine resin has particularly low Dk and Df among synthetic resins, the dielectric has excellent electric characteristics. Moreover, since the base main layer of the dielectric includes the base material, e.g., the strength, planar dimensional stability, and handiness of the dielectric can be improved. With the base material, the dimensional stability before and after etching can be improved, and the coefficient of thermal expansion in a planar direction upon heating can be reduced.

The base main layer is made of melting fluorine resin. Both surfaces of the base main layer are covered with the base cover layers made of melting fluorine resin. On the outside of the base cover layers, the functional layers made of fluorine resin mixed with the hollow filler are laminated.

Since the base main layer is made of melting fluorine resin, the base main layer flows under a high temperature. Thus, an air gap in the base main layer containing the base material can be reduced. On the other hand, there is a probability that the surface of the base main layer changes and the base material is exposed through the base main layer.

If the base material is exposed, there is a probability that the base material contacts the hollow filler contained in the functional layer and an air gap is formed. Since the base cover layer containing no base material and no hollow filler and made of only fluorine resin is provided between these layers, the above-described defect can be prevented.

Fluorine resin has excellent electric characteristics, but the Dk cannot be decreased to 2.1 or less only by fluorine resin. Since the hollow filler containing air (gas) having a lower Dk than that of fluorine resin is mixed, the Dk of the dielectric can be 2.1 or less.

A great amount of hollow fillers is contained in the functional layer so that the coefficient of thermal expansion of the dielectric in the thickness direction thereof can be reduced. Thus, according to the dielectric, the electric characteristics can be improved while the coefficients of thermal expansion in the planar direction and the thickness direction are reduced.

Preferably, the material of the hollow filler is silica, and the surface thereof is modified. Preferably, at 10 GHz, the Dk of the dielectric is 2.1 or less, and the Df of the dielectric is 0.002 or less.

Although details will be described later, tendency shows that only by mixing the hollow filler, the Df does not decrease and conversely increases as compared to a case of mixing a solid filler. It has been found that the surface of the hollow filler is modified using a predetermined silane-based compound, and in this manner, the Df can also be decreased with a Dk of 2.1 or less ensured.

Thus, according to the dielectric, a Dk of 2.1 or less and a Df of 0.002 or less can be obtained, and high electric characteristics can be achieved.

Preferably, the base main layer and the base cover layers contain perfluoroalkoxy alkane (PFA), and the functional layers contain polytetrafluoroethylene (PTFE).

The Dk and Df of PFA are poorer than those of PTFE, but are extremely lower as compared to other resins. Thus, the base main layer and the base cover layers having excellent electric characteristics can be formed. PTFE has the best electric characteristics among fluorine resins. Thus, the functional layers having excellent electric characteristics can be formed.

Preferably, the median diameter of the hollow filler is 0.5 μm or more and 20 μm or less.

In a case where the size of the hollow filler is less than 0.5 μm, the hollow fillers are easily agglomerated, and for this reason, it is difficult to uniformly disperse the hollow fillers and variation in the Dk of the dielectric is easily caused. On the other hand, in a case where the size of the hollow filler is more than 20 μm, the dielectric is increased in thickness, and a circuit board is also increased in thickness.

The volume ratio of the hollow filler with respect to the dielectric may be 35% or more and 65% or less.

With this configuration, an effect of improving the electric characteristics and reducing the coefficient of thermal expansion by the hollow filler can be obtained while the reliability of a through-hole in the circuit board is stably ensured.

A copper clad laminate may include the above-described dielectric including copper foil as a conductive layer. A circuit board may be formed using the above-described copper clad laminate. As a result, high-quality copper clad laminate and circuit board can be obtained.

The disclosed technique also relates to a method for manufacturing a copper clad laminate including a dielectric formed by lamination of fluorine resin.

The above-described method includes a step of forming a base main layer by impregnating a base material with melting fluorine resin, a step of forming a base cover layer by applying melting fluorine resin onto the base main layer, a step of forming a functional layer by impregnating the base material formed with the base main layer and the base cover layer with fluorine resin mixed with a hollow filler including a hollow fine particle, a step of acquiring a predetermined molded sheet by cutting prepreg (dielectric) including the base main layer, the base cover layer, and the functional layer into a predetermined size, and a step of applying copper foil onto the surface of the molded sheet and molding the molded sheet into a plate shape.

That is, according to this manufacturing method, the prepreg can be manufactured in such a manner a similar impregnating step is repeated using the same device while fluorine resin dispersion is replaced.

Preferably, silica is used as the material of the hollow filler, and treatment of modifying the surface of the hollow filler using a silane-based compound is executed.

With this configuration, both the Dk and the Df can be decreased, and the electric characteristics of the dielectric can be improved.

Preferably, the silane-based compound to be used includes at least one selected from methyltrimethoxysilane, methyltriethoxysilane, dimethoxydimethylsilane, diethoxydimethylsilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, octyltrimethoxysilane, octyltriethoxysilane, decyltrimethoxysilane, decyltriethoxysilane, hexamethyldisilazane, trifluoropropyltrimethoxysilane, trifluoropropyltriethoxysilane, diphenyldimethoxysilane, diphenyldiethoxysilane, and diphenylsilanediol.

With these silane-based compounds, a Dk of 2.1 or less and a Df of 0.002 or less can be obtained, and high electric characteristics can be achieved.

Preferably, the base main layer and the base cover layer contain perfluoroalkoxy alkane, and the functional layer contains polytetrafluoroethylene.

Any of PFA and PTFE has extremely low Dk and Df. Thus, the dielectric can be formed with excellent electric characteristics.

Advantages of the Invention

According to the dielectric to which the disclosed technique is applied, the electric characteristics can be improved while the original functional requirement is satisfied. Thus, the dielectric is used for information and communication equipment that handles a high frequency band such as a microwave to a millimeter wave so that the performance of the equipment can be enhanced. This contributes to development of a telecommunication technique.

DESCRIPTION OF EMBODIMENTS

<Copper Clad Laminate>

Figure 1:
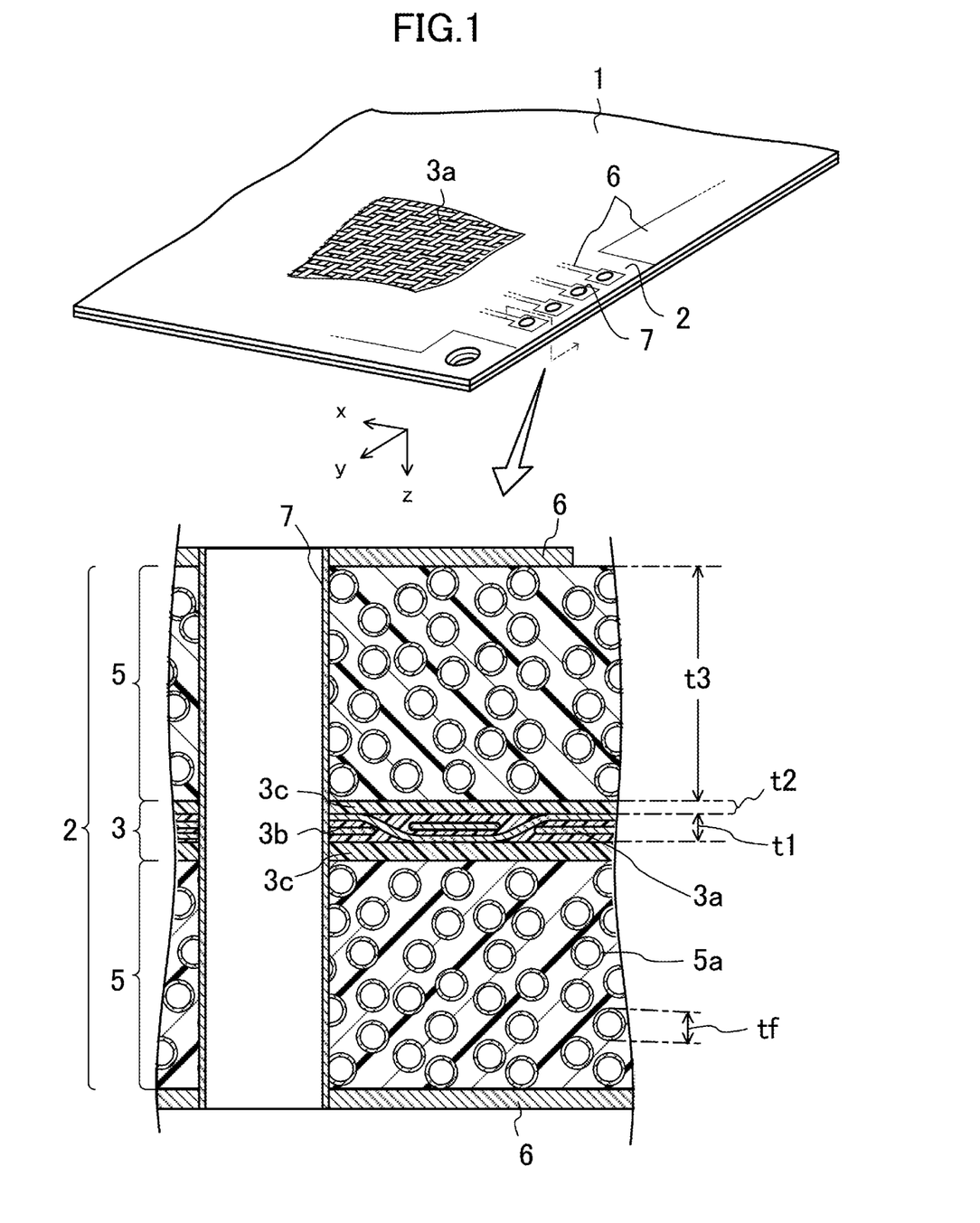
FIG. 1 is a view for describing the structure of a circuit board to which the disclosed technique is applied.

FIG. 1 shows, as an example, a circuit board 1 to which the disclosed technique is applied. According to arrows shown in FIG. 1, the planar direction of the circuit board 1 will also be referred to as an XY direction, and the thickness direction of the circuit board 1 will also be referred to as a Z direction.

A dielectric 2 of the circuit board 1 has a small thickness (size in the Z direction), is suitable for size reduction, and has excellent electric characteristics. That is, the dielectric 2 is designed such that the relative permittivity Dk and dissipation factor Df (hereinafter merely referred to as Dk and Df) thereof at 10 GHz are extremely small. Thus, the circuit board 1 is suitable for information and communication equipment (for example, a mobile phone or an automotive radar) that handles a high frequency band such as a microwave to a millimeter wave.

Hereinafter, a specific configuration of the circuit board 1 will be described. The dielectric 2 is an insulating layer having a base layer 3 and a pair of functional layers 5 in the Z direction and formed in such a manner that fluorine resin having excellent electric characteristics is laminated.

The base layer 3 is arranged in a center portion of the dielectric 2 in the Z direction, and includes a base main layer 3b containing a base material 3a and a pair of base cover layers 3c containing only fluorine resin. The base layer 3 forms the framework of the dielectric 2. The functional layer 5 contains a great amount of hollow fine particles (hereinafter also referred to as a hollow filler(s) 5a). A large portion of the dielectric 2 is formed of the functional layers 5.

On both outer surfaces of the dielectric 2, a pair of conductive layers 6 is formed using a predetermined thickness (e.g., 18 µm) of copper foil (one example of a metal thin film having excellent electric conductivity). The dielectric 2 and the conductive layers 6 form a copper clad laminate. The conductive layers 6 of the circuit board 1 are subjected to treatment such as etching. In this manner, electric circuits (so-called printed wiring) in a predetermined pattern are formed.

A hole (through-hole 7) penetrating the circuit board 1 in the Z direction is formed at a predetermined position in the circuit board 1. The inner surface of the through-hole 7 is covered with, e.g., copper plating. With this configuration, predetermined portions of the electric circuits formed on both surfaces of the circuit board 1 are electrically connected to each other through the through-hole 7.

(Base Layer 3)

The base layer 3 includes, as described above, the base main layer 3b containing the base material 3a and the base cover layers 3c containing only fluorine resin. Each of the base main layer 3b and the base cover layers 3c is made of melting perfluoroalkoxy alkane (PFA, copolymer of tetrafluoroethylene and perfluoroalkoxy ethylene).

The base material 3a is formed of a flexible sheet-shaped member, and as in a partially-cut-out portion of the circuit board 1 shown on the upper side in FIG. 1, contains a material having excellent dimensional stability. Such a material is selected from materials having both low Dk and Df. Specific examples of the base material 3a may include glass cloths made of quartz glass, E glass, and NE glass and a film made of polyimide.

PFA is melting fluorine resin. That is, PFA is melted (liquified) by heating to the melting point (300° C. to 310° C.) thereof or higher, and as a result, has high flowability. As described later, the base layer 3 is heated at a temperature higher than the melting point of PFA when prepreg is formed. Thus, PFA can spread across the entirety of the base material 3a, and formation of an air gap (void) in the base main layer 3b can be reduced.

The Dk and Df of PFA are poorer than those of polytetrafluoroethylene (PTFE) described later, but are extremely lower as compared to other resins. Thus, the base main layer 3b also has excellent electric characteristics.

Further, the base main layer 3b contains the base material 3a. Thus, even in a case where the base main layer 3b is made of fluorine resin, the base main layer 3b has excellent dimensional stability in the XY direction, and a dimensional change before and after etching can be reduced. The general coefficient of thermal expansion (CTE) of fluorine resin is about 100 ppm/° C., and is higher than those of other resins (for example, the CTE of epoxy resin is about 40 ppm/° C.). Thus, it can be said that a dimensional change in fluorine resin easily occurs in association with a temperature change.

On the other hand, in the case of the circuit board 1 containing the base material 3a, the CTE in the XY direction can be suppressed at 10 ppm/° C. or more and 20 ppm/° C. or less. Thus, the CTE (about 15 ppm/° C.) of the copper foil of the conductive layer 6 and the CTE of the dielectric 2 are substantially coincident with each other, and therefore, disconnection in the planar direction can be reduced even when heat is applied. Moreover, since the base material 3a functions as the framework of the circuit board 1, the dielectric 2 has tension and workability in delivery is also improved.

The thickness t1 of the base main layer 3b is preferably 10 µm or more and 30 µm or less. In a case where the thickness t1 is less than 10 µm, there is a probability of the base material 3a being exposed. On the other hand, in a case where the thickness t1 is more than 30 µm, if the dielectric 2 is thin, the thickness of the functional layer 5 is relatively smaller, leading to interference with a decrease in the Dk and Df of the dielectric 2. Thus, the thickness t1 of the base main layer 3b is preferably about 10 to 30 µm.

Each base cover layer 3c is made of only PFA, and the base cover layers 3c are laminated on both surfaces of the base main layer 3b in the Z direction. The outer surface of each base cover layer 3c is formed at a position apart at least from the base material. Specifically, each base cover layer 3c is formed such that the outer surface thereof is positioned with a distance in the Z direction from the surface of the base main layer 3b in order for the base material 3a not to be exposed through the base main layer 3b.

As described above, since melting PFA is used as the material of the base main layer 3b, liquefied PFA enters a gap in the base material 3a upon formation of the prepreg, and therefore, formation of an air gap in the base main layer 3b can be reduced. However, when PFA forming the base main layer 3b is liquefied, the surface of the base main layer 3b may change and the base material 3a may be exposed through the base main layer 3b.

In a case where the base material 3a is exposed and the fillers 5a included in the functional layer 5 and the base material 3a contact each other, an air gap may be formed at such a contact portion. On the other hand, since the base cover layer 3c is interposed between the base main layer 3b and the functional layer 5 and functions as a buffer region, the above-described defect can be prevented.

Further, the base cover layers 3c are provided on both sides of the base main layer 3b containing the base material 3a so that occurrence of conductive anode filaments (CAFs) can be further reduced.

The thickness t2 of the base cover layer 3c is preferably 10 μm or less. Practically, the thickness t2 may be 1 μm or more and 10 μm or less. In a case where the thickness t2 is more than 10 μm, if the dielectric 2 is thin, the thickness t3 of the functional layer 5 is relatively smaller, leading to interference with a decrease in the Dk and Df of the dielectric 2. Thus, the thickness t2 of the base cover layer 3c is preferably 10 μm or less.

(Functional Layer 5)

The functional layer 5 contains non-melting PTFE mixed with the hollow fillers 5a, and is laminated on the outer surface of the base cover layer 3c in the Z direction. Normally, the functional layer 5 is a layer having the greatest thickness in the dielectric 2, and forms a main portion of the dielectric 2.

Specifically, the thickness t3 of each functional layer 5 is preferably 15 μm or more and 60 μm or less, but is set as necessary according to the specifications of the circuit board 1.

PTFE has the lowest Dk and Df among fluorine resins, and has the best electric characteristics (Dk=2.1, Df=0.0002). On the other hand, PTFE is not melted even by heating to the melting point thereof or higher (non-melting). PTFE lacks flowability, and cannot be melt-molded.

PTFE normally contains fine particles having a particle size of about several tens of nm to several m, and the powder thereof is molded by compression and heating. Thus, PTFE is difficult to be handled. In a case where the base main layer 3b is made of PTFE, it is difficult to spread PTFE across the entirety of the base material 3a, and an air gap is formed in the base main layer 3b. For this reason, there is a probability of insulation reliability being influenced, and there is also a probability of a functional requirement for the circuit board 1 being not satisfied.

On the other hand, as described above, since PFA is used as the material of the base main layer 3b and is heated at a temperature higher than the melting point thereof upon formation of the prepreg, formation of an air gap in the base main layer 3b can be reduced.

PTFE has the best electric characteristics among synthetic resins as described above, but the Dk of PTFE is 2.1. Thus, only by forming the dielectric 2 using PTFE, the Dk thereof cannot be decreased to 2.1 or less.

On the other hand, in the circuit board 1, each functional layer 5 of the dielectric 2 contains PTFE, and is further mixed with the hollow fillers 5a. The hollow filler 5a contains air (gas) having a lower Dk than that of PTFE. Thus, a great amount of hollow fillers 5a is contained in the functional layer 5 so that the Dk of the dielectric 2 can be 2.1 or less.

Further, a great amount of hollow fillers 5a is contained in the functional layer 5 so that the amount of PTFE can be relatively decreased.

The hollow filler 5a is a fine spherical hollow particle using silica (Dk=3 or more) as a material. Currently, the hollow fillers 5a having various sizes (median diameters) from a nanometer level are available. In the case of the dielectric 2, the size tf of the hollow filler 5a is preferably 0.5 μm or more and 20 μm or less.

In a case where the size tf of the hollow filler 5a is less than 0.5 μm, the hollow fillers are easily agglomerated, and for this reason, it is difficult to uniformly disperse the hollow fillers 5a and variation in the Dk of the functional layer 5 is easily caused.

On the other hand, in a case where the size tf of the hollow filler 5a is more than 20 μm, the dielectric 2 is increased in thickness, and the circuit board 1 is also increased in thickness. For this reason, the circuit board 1 including the dielectric 2 having a thickness of 50 μm or less cannot be produced.

In a case where the size tf of the hollow filler 5a is 0.5 μm or more and 20 μm or less, such a size is an appropriate size for mixing a great amount of hollow fillers 5a with respect to the thickness of the functional layer 5. Thus, the effect of the hollow filler 5a can be produced while the above-described defect is reduced.

The volume ratio (volume ratio of the hollow fillers 5a with respect to the dielectric 2, specifically percentage of the total volume of the hollow fillers 5a with respect to the volume of the dielectric 2 including the base layer 3 and the functional layers 5) of the hollow fillers 5a is preferably 35% or more and 65% or less.

In a case where the volume ratio of the hollow fillers 5a is less than 35%, the hollow fillers 5a are only scattered in the functional layer 5, and for this reason, the effect of the mixed hollow fillers 5a cannot be substantially obtained. Moreover, the CTE in the Z direction is high, and for this reason, the through-hole 7 may be disconnected in a case where the circuit board 1 is exposed to a high temperature.

On the other hand, in a case where the volume ratio of the hollow fillers 5a is more than 65%, the Df and a water absorption may be high.

In a case where the volume ratio of the hollow fillers 5a is 35% or more and 65% or less, the Dk of the dielectric 2 can be 2.1 or less while the above-described defect is reduced.

The Df of air is smaller than those of PTFE and silica. Thus, in a case where a great amount of hollow fillers 5a is mixed with the functional layer 5, the Df of the dielectric 2 is expected to be decreased. However, tendency shows that only by mixing a great amount of hollow fillers 5a, the Df does not decrease and conversely increases as compared to a solid filler.

Figure 2:
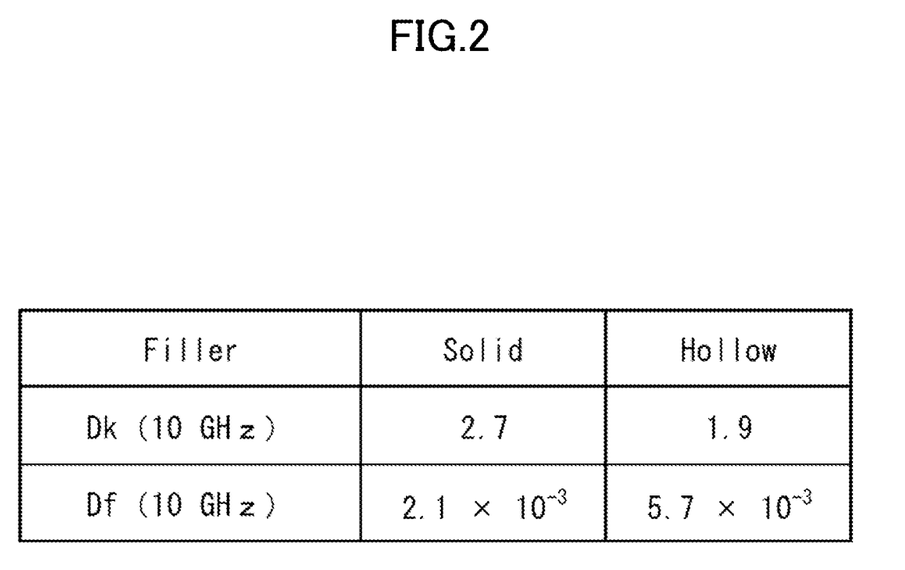
FIG. 2 is a table of electric characteristics of each of solid and hollow fillers.

FIG. 2 shows one example. FIG. 2 shows the Dk and Df of the dielectric 2 experimentally produced using the solid filler or the hollow filler 5a. Conditions are the same as each other except for the difference between the solid filler and the hollow filler. The Dk decreases in the case of using the hollow filler 5a, but the Df is higher in the case of using the hollow filler 5a.

For this reason, study was conducted on modification of the surface of the hollow filler 5a in order to decrease the Df. As a result, it was found that using a predetermined silane compound, the Df can also be decreased with a Dk of 2.1 or less ensured.

Thus, the hollow filler 5a (hereinafter also referred to as a modified hollow filler(s) 5a) having the surface modified with the predetermined silane compound is used for the functional layer 5 of the dielectric 2. As a result, in the dielectric 2, a Dk of 2.1 or less and a Df of 0.002 or less are obtained, and high electric characteristics are achieved.

<Method for Manufacturing Circuit Board 1>

The exemplified circuit board 1 can be manufactured in such a manner that the prepreg forming the dielectric 2 is formed and is subsequently molded together with the copper foil. Note that treatment of modifying the surface of the hollow filler 5a is executed in advance of formation of the functional layer 5 and will be described later.

Figure 3:
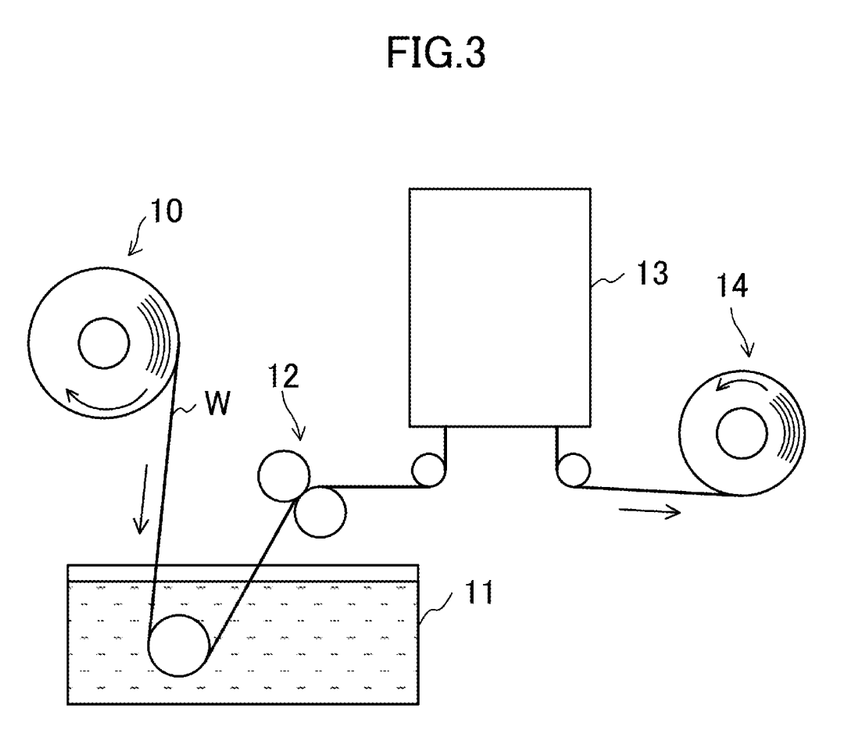
FIG. 3 is a view for describing a method for manufacturing prepreg (dielectric).

FIG. 3 shows a process of manufacturing the prepreg using a roll-to-roll impregnating device. The impregnating device includes an unwinder 10, an impregnating tank 11, a thickness adjustment roller 12, a drying furnace 13, a winder 14, etc.

The unwinder 10 unwinds a base material W to be impregnated. The impregnating tank 11 stores dispersion liquid (dispersion, aqueous dispersion with fine fluorine resin particles) containing fluorine resin, with which the base material W is to be impregnated. The thickness adjustment roller 12 adjusts the amount of dispersion liquid with which the base material W has been impregnated. The drying furnace 13 heats, at a predetermined temperature, the base material W delivered with impregnated with the dispersion liquid. The winder 14 winds the base material W with the impregnated dispersion liquid dried.

(First Step)

After a roll of the base material W has been set on the unwinder 10, the base material W is wound at a certain speed by the winder 14. In this manner, the base material W is delivered at the predetermined speed. Dispersion liquid (first dispersion) containing, e.g., PFA is stored in the impregnating tank 11, and the base material W is impregnated with the first dispersion while delivered.

In this manner, the base material W is impregnated with, e.g., PFA. Next, the thickness adjustment roller 12 adjusts the amount (impregnating amount) of, e.g., PFA with which the base material W has been impregnated. Then, the base material W is dried by heating at the predetermined temperature, and thereafter, is wound by the winder 14.

Note that the first step is not limited to once and may be repeated twice or more until a target impregnating amount. The target impregnating amount is set considering the thickness of the base layer 3, i.e., both the base main layer 3b and the base cover layer 3c.

(Second Step)

Subsequently, the roll of the base material W (first base material W1) impregnated with the target amount in the first step is set on the unwinder 10, and the functional layers 5 are formed. That is, the first dispersion is replaced with dispersion liquid (second dispersion) containing, e.g., the modified hollow fillers 5a and PTFE. Then, the first base material W1 is impregnated with the second dispersion.

After the first base material W1 has been impregnated with the second dispersion, the thickness adjustment roller 12 adjusts the impregnating amount to a predetermined impregnating amount. Then, the first base material W1 is heated at a predetermined temperature in the drying furnace 13, and in this manner, the functional layers 5 having a predetermined thickness (about 50 km) are formed on the first base material W1. Note that the second step is not limited to once and may be repeated twice or more until a target impregnating amount as in the first step.

In this manner, the base material W formed with the base layer 3 and the functional layers 5, i.e., the prepreg to be the dielectric 2, is acquired.

(Third Step, Fourth Step)

The acquired roll-shaped prepreg is cut to a predetermined size, and a molded sheet with the predetermined size is acquired (third step). Then, copper foil is laminated with a predetermined thickness (for example, 18 km) in a plate shape on the surfaces (both front and back surfaces of the dielectric 2) of the molded sheet (fourth step). Specifically, the molded sheet is pressurized in the Z direction at a predetermined temperature (for example, 380° C.) using a predetermined press.

At this point, PFA is heated to a temperature higher than the melting point thereof. In addition, PFA is also pressurized. Thus, PFA is melted and flows so as to enter a gap in the base material 3a. Thus, an air gap in the base main layer 3b can be reduced. Since the base cover layers 3c are provided in the base layer 3, exposure of the base material 3a at this point can be prevented.

Moreover, in this manner, the copper foil of the conductive layers 6 is pressure-bonded to both surfaces of the molded sheet, and the copper clad laminate is formed. Thereafter, the electric circuits are formed according to the specifications, and in this manner, the circuit board 1 is produced.

<Treatment of Modifying Hollow Filler 5a>

In advance of the second step of forming the functional layers 5, the treatment of modifying the surface of the hollow filler 5a is executed. Specifically, the treatment of modifying the surface of the hollow filler 5a is executed using a predetermined surface treatment reagent.

The surface treatment reagent to be used is a silane-based compound, and is specifically preferably at least one selected from methyltrimethoxysilane, methyltriethoxysilane, dimethoxydimethylsilane, diethoxydimethylsilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, octyltrimethoxysilane, octyltriethoxysilane, decyltrimethoxysilane, decyltriethoxysilane, hexamethyldisilazane, trifluoropropyltrimethoxysilane, trifluoropropyltriethoxysilane, diphenyldimethoxysilane, diphenyldiethoxysilane, and diphenylsilanediol. The surface of the hollow filler 5a is modified using these surface treatment reagents so that a Dk of 2.1 or less and a Df of 0.002 or less can be obtained in terms of the electric characteristics of the dielectric 2.

A method for performing the modification treatment using the silane-based compound has been generally known, and such a general method can be used. For example, a predetermined amount of hollow fillers 5a is injected into and mixed with an acetic acid solution (pH=3). A predetermined amount of silane-based compound required for modification is added to the resultant. The resultant is sufficiently mixed under a room temperature condition (for example, 1500 rpm and one hour), and thereafter, the hollow fillers 5a taken out by removal of a solvent are dried under a predetermined condition (for example, 100° C. and 15 hours). Subsequently, the hollow fillers 5a are crushed into the modified hollow fillers 5a.

A hydroxyl group present in great amount on the surface of the untreated hollow filler is replaced with another functional group with a low Df after modification. Thus, in terms of the electric characteristics of the dielectric 2, a Df of 0.002 or less can also be obtained.

<Prototype Examples>

Figure 4:
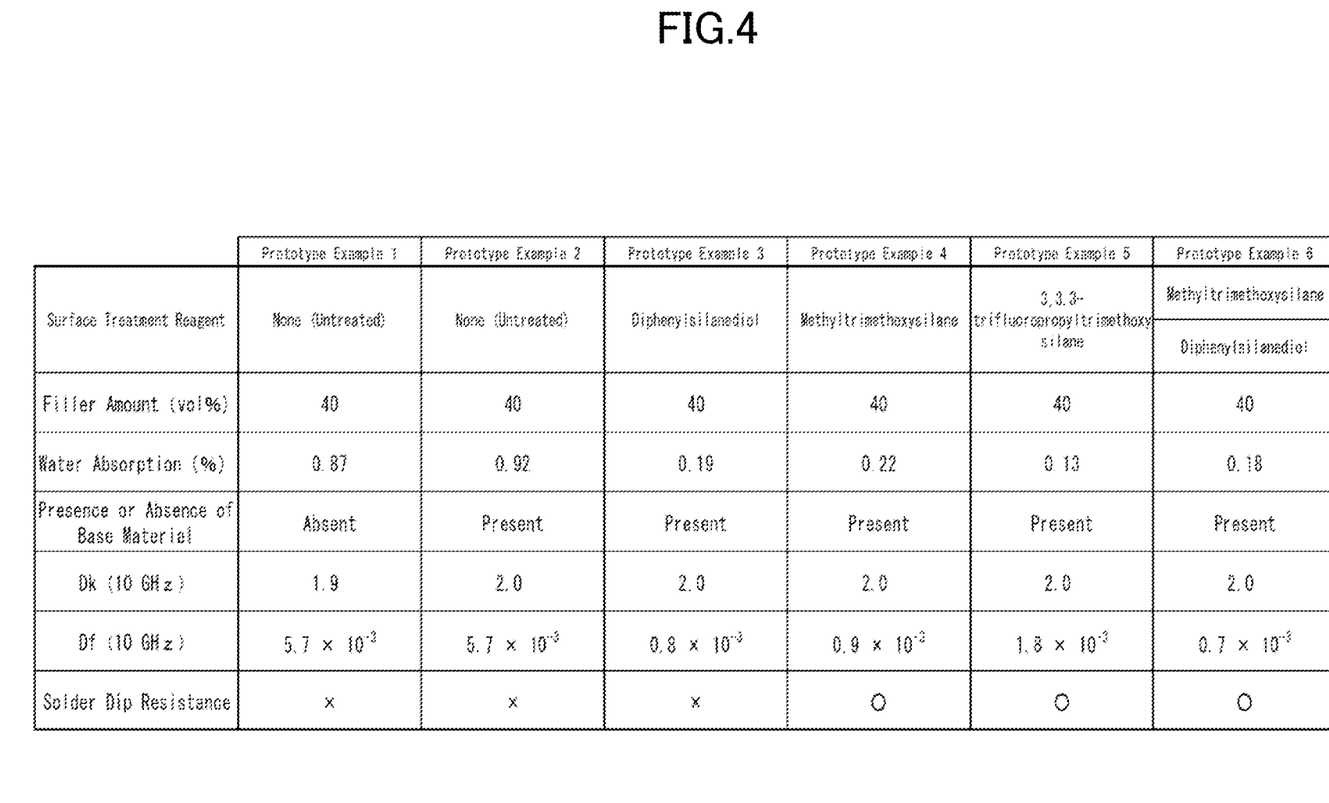
FIG. 4 is a table of prototype examples regarding modification of the hollow filler.

FIG. 4 shows prototype examples of the dielectric 2 in terms of the modified hollow filler 5a. Under the same conditions, the dielectric 2 was experimentally produced with some of the conditions changed. A hollow filler 5a amount (volume ratio of the hollow fillers 5a described above) was the same amount, i.e., 40%. A water absorption was a value in an ordinary state. Solder dip resistance was obtained after the dielectric 2 had been held for 120 seconds at 260° C. Note that these test details are in accordance with JIS C 6481.

Prototype Example 1 and Prototype Example 2 were dielectrics 2 using unmodified untreated hollow fillers. Prototype Example 2 is different from Prototype Example 1 in that Prototype Example 2 contains a base material. In each dielectric 2 of Prototype Examples 3 to 6, an untreated hollow filler was modified using a corresponding silane-based compound. In Prototype Example 6, the hollow filler was modified using methyltrimethoxysilane, and thereafter, was further modified using diphenylsilanediol.

Prototype Example 1 and Prototype Example 2 using no modified hollow fillers 5a showed a high water absorption, and on the other hand, Prototype Examples 3 to 6 using the modified hollow fillers 5a showed a decrease in the water absorption. Thus, the insulation reliability was improved.

Since the hollow filler 5a is used in any of the dielectrics 2 of Prototype Examples 1 to 6, a Dk of 2.1 or less which falls below the value of PTFE was obtained. Further, in terms of the Df, Prototype Example 1 and Prototype Example 2 using no modified hollow fillers 5a showed about 0.006, and on the other hand, Prototype Examples 3 to 6 using the modified hollow fillers 5a showed 0.002 or less.

Particularly, in Prototype Examples 3, 4, 6, a Df of 0.001 or less was obtained. Note that Prototype Example 3 showed poor solder dip resistance. Thus, Prototype Example 3 cannot be practically used as it is.

However, as shown in Prototype Example 6, it was confirmed that by combination with the silane-based compound, the solder dip resistance can be improved while excellent electric characteristics are obtained. Thus, plural types of silane-based compounds may be used in combination.

According to the dielectric to which the disclosed technique is applied as described above, while original functional requirements for the dielectric, such as the dimensional stability and the solder dip resistance, are satisfied, both the Dk and the Df can be decreased and the electric characteristics can be improved. Thus, the dielectric is used for information and communication equipment that handles a high frequency band such as a microwave to a millimeter wave so that the performance of the equipment can be enhanced. This contributes to development of a telecommunication technique.

(Variations)

Figure 5:
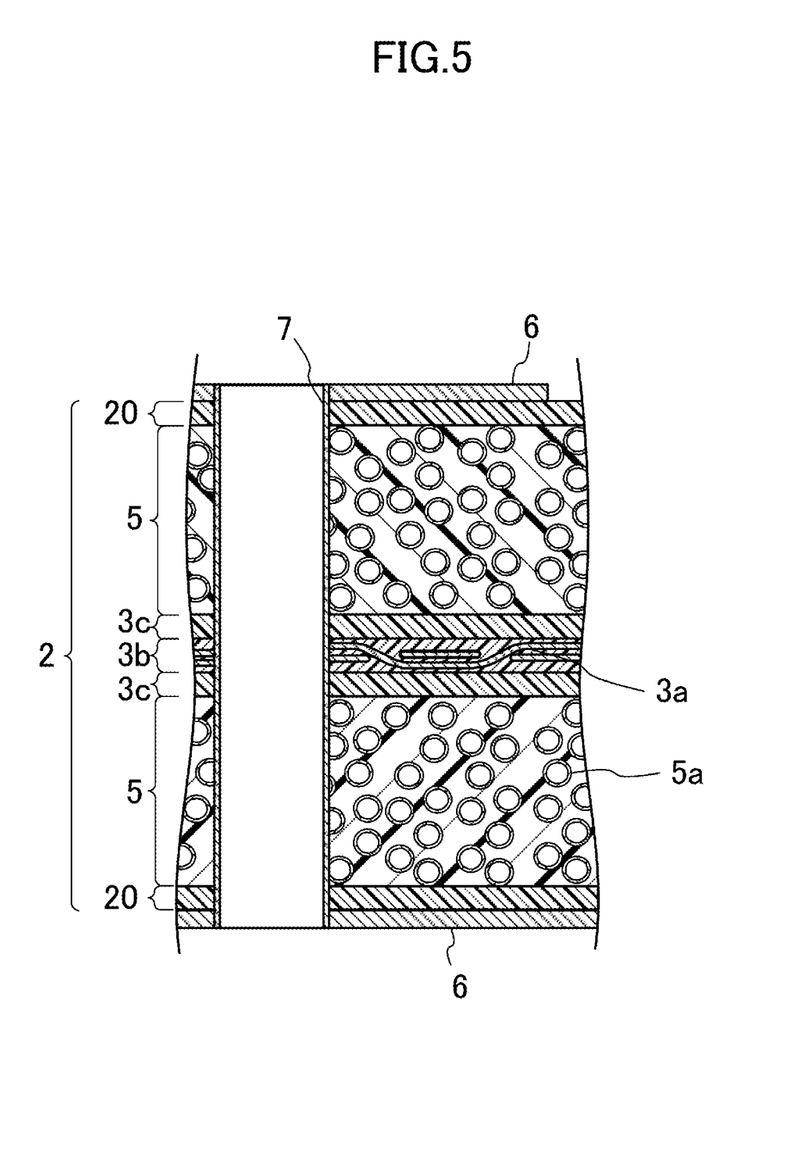
FIG. 5 is a view for describing a variation of the dielectric.

FIG. 5 shows a variation of the circuit board 1. In this circuit board 1, a cover layer 20 is provided outside each functional layer 5 in the Z direction. The cover layer 20 is a layer containing only melting or non-melting fluorine resin, and covers each functional layer 5. For example, the cover layer 20 is a layer containing only PTFE, and contains no modified hollow fillers 5a.

These cover layers 20 are provided in the dielectric 2 so that exposure of the modified hollow fillers 5a through the surface of the functional layer 5 can be prevented. Moreover, the surface of the dielectric 2 can be a smooth flat surface, and therefore, adhesion with the conductive layer 6 (copper foil) laminated thereon can be improved. Note that the cover layer 20 may be PFA. Since the function of the cover layer 20 is the same as that of the base cover layer 3c, the thickness thereof may be the same as that of the base cover layer 3c.

The disclosed technique is not limited to the above-described embodiments, and also includes various other configurations. For example, the conductive layer 6 may be formed only on one surface of the dielectric 2, and in this case, the through-hole 7 is not essential.

DESCRIPTION OF REFERENCE CHARACTERS

1 Circuit Board
2 Dielectric
3 Base Layer
  3a Base Material
  3b Base Main Layer
  3c Base Cover Layer
5 Functional Layer
  5a Hollow Filler
6 Conductive Layer

The invention claimed is:

1. A dielectric for a circuit board, which is formed by lamination of fluorine resin, comprising:
    a base main layer containing a sheet-shaped base material and made of melting fluorine resin;
    a pair of base cover layers made of melting fluorine resin and formed on both surfaces of the base main layer such that at least outer surfaces thereof are positioned apart from the base material; and
    a pair of functional layers made of fluorine resin mixed with a hollow filler including a hollow fine particle and laminated on the outer surfaces of the base cover layers, wherein at 10 GHz, a relative permittivity of the dielectric is 2.1 or less, and a dissipation factor of the dielectric is 0.002 or less.

2. The dielectric of claim 1, wherein
a material of the hollow filler is silica, and a surface thereof is modified, and
at 10 GHz, a relative permittivity of the dielectric is 2.1 or less, and a dissipation factor of the dielectric is 0.002 or less.

3. The dielectric of claim 2, wherein
the surface of the hollow filler is modified using a silane-based compound.

4. The dielectric of claim 1, wherein
the base main layer and the base cover layers contain perfluoroalkoxy alkane, and the functional layers contain polytetrafluoroethylene.

5. The dielectric of claim 1, wherein
a median diameter of the hollow filler is 0.5 μm or more and 20 μm or less.

6. The dielectric of claim 1, wherein
a volume ratio of the hollow filler with respect to the dielectric is 35% or more and 65% or less.

7. A copper clad laminate comprising:
the dielectric of claim 1, which includes copper foil as a conductive layer.

8. A circuit board comprising:
the copper clad laminate of claim 7.

9. A method for manufacturing a copper clad laminate including a dielectric formed by lamination of fluorine resin, comprising:
    a step of forming a base main layer by impregnating a base material with melting fluorine resin;
    a step of forming a base cover layer by applying melting fluorine resin onto the base main layer;
    a step of forming a functional layer by impregnating the base material formed with the base main layer and the base cover layer with fluorine resin mixed with a hollow filler including a hollow fine particle;

a step of acquiring a predetermined molded sheet by cutting prepreg including the base main layer, the base cover layer, and the functional layer into a predetermined size; and a step of applying copper foil onto a surface of the molded sheet and molding the molded sheet into a plate shape, wherein silica is used as a material of the hollow filler, and treatment of modifying a surface of the hollow filler using a silane-based compound is executed.

10. The manufacturing method of claim 9, wherein the silane-based compound to be used includes at least one selected from methyltrimethoxysilane, methyltriethoxysilane, dimethoxydimethylsilane, diethoxydimethylsilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, octyltrimethoxysilane, octyltriethoxysilane, decyltrimethoxysilane, decyltriethoxysilane, hexamethyldisilazane, trifluoropropyltrimethoxysilane, trifluoropropyltriethoxysilane, diphenyldimethoxysilane, diphenyldiethoxysilane, and diphenylsilanediol.

11. The manufacturing method of claim 9, wherein the base main layer and the base cover layer contain perfluoroalkoxy alkane, and the functional layer contains polytetrafluoroethylene.

\* \* \* \* \*